(12) United States Patent
Asami

(10) Patent No.: US 6,819,406 B2
(45) Date of Patent: Nov. 16, 2004

(54) ALIGNER

(75) Inventor: Masatoshi Asami, Tokyo (JP)

(73) Assignee: Adtec Engineering Co., Ltd., Tokyo (JP)

( * ) Notice: Subject to any disclaimer, the term of this patent is extended or adjusted under 35 U.S.C. 154(b) by 0 days.

(21) Appl. No.: 10/191,935

(22) Filed: Jul. 9, 2002

(65) Prior Publication Data

US 2003/0016342 A1 Jan. 23, 2003

(30) Foreign Application Priority Data

Jul. 19, 2001 (JP) ........................................ 2001-218886

(51) Int. Cl.[7] ........................ G03B 27/02; G03B 27/58; G03B 27/62
(52) U.S. Cl. ............................... 355/78; 355/72; 355/75
(58) Field of Search ............................. 355/78, 72, 75, 355/95, 76, 91, 53, 87, 85; 378/34, 35; 356/399; 430/5, 30; 310/12

(56) References Cited

U.S. PATENT DOCUMENTS

| | | | |
|---|---|---|---|
| 5,257,067 A | * | 10/1993 | Sakamoto et al. ............ 355/91 |
| 5,434,648 A | * | 7/1995 | Koga et al. .................... 355/76 |
| 5,543,890 A | * | 8/1996 | Tanaka et al. ................. 355/53 |
| 6,459,474 B1 | * | 10/2002 | Okada .......................... 355/78 |
| 2003/0007139 A1 | * | 1/2003 | Momose et al. ............... 355/72 |

* cited by examiner

Primary Examiner—Peter B. Kim
(74) Attorney, Agent, or Firm—Nields & Lemack

(57) ABSTRACT

An aligner which enables a uniform close contact between a photo mask and a printed circuit board is provided. The aligner includes: a photo mask (20) provided with tapered portions (21); a mask holder (2) for supporting the photo mask (20) at the tapered portions; a copy frame (1) for supporting the mask holder (2); a load regulating system (3); and a Z-axis moving system (8) having supporting arms (80) on which the mask holder (2) is placed through the load regulating system (3); and a guide system (4) having a guide shaft (40), so that the photo mask (20) can be moved relative to a printed circuit board (B) while maintaining the position in X and Y directions by the guidance of the guide system (4). The photo mask (20) closely contacts with a printed circuit board (B) by a tare weight of the copy frame (1), mask holder (2), and the photo mask (20), and the contact pressure is regulated by the load regulating system (3). The copy frame (1) can be manipulated on a slant with respect to the guide shaft (40) of the guide system (4), whereby the contact uniformity between the photo mask (20) and printed circuit board (B) is improved.

15 Claims, 11 Drawing Sheets

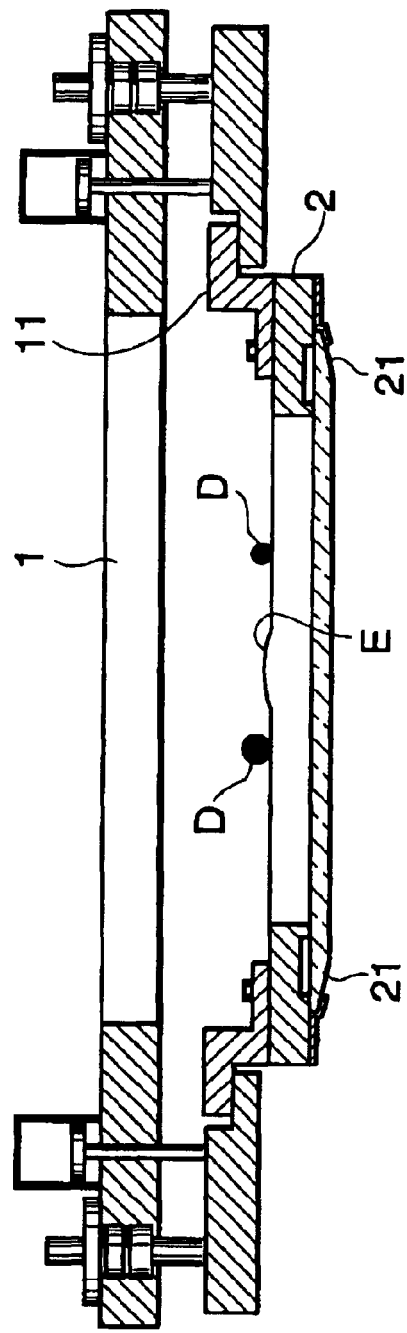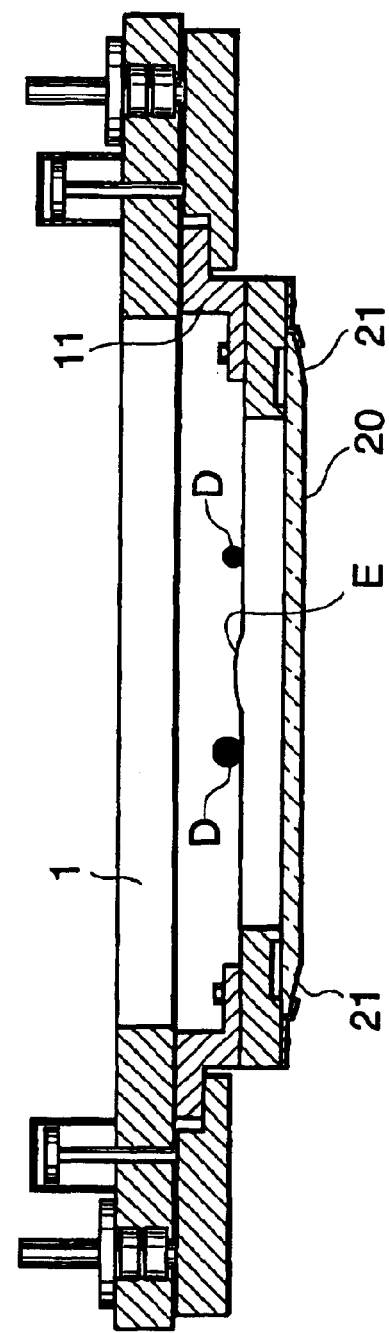

ALIGNER

BACKGROUND OF THE INVENTION

1. Field of the Invention

The present invention relates to an aligner.

2. Related Art

A printed circuit board has become more compact and slimmer with downsizing electrical appliances and with decreasing their thicknesses. Recently, a photolithographic method is used as a technique for manufacturing printed circuit boards. An aligner as in the case of a semiconductor has been used to carry out a method for printing a circuit pattern patterned in a photo mask on a substrate which is an object to be exposed.

There are two methods of performing exposure while keeping the photo mask in contact with the object to be exposed and while keeping a photo mask away from contact with the object to be exposed. The former method needs uniform contact for exposure with high accuracy.

As a method to perform exposures with high accuracy, it has been proposed to evacuate a space between a photo mask and object to be exposed to force them into close contact with each other. However, in the case of a stepping exposure which has been proposed in recent years, it is relatively difficult to increase a vacuum level because a photo mask is smaller than the object to be exposed. Accordingly it is most suitable to use a so called soft contact method not including the forced-pressing as described above.

However in soft contact method without the forced close contact mentioned above, there has been a problem that it becomes very difficult to maintain the parallelisms of the photo mask and the object to be exposed and to maintain a uniform contact pressure.

The object of the invention is to solve the problems in connection with the related art described above.

SUMMARY OF THE INVENTION

To accomplish the objects, an aligner according to the invention is characterized by comprising: an object to be exposed supporting means for supporting an object to be exposed; a photo mask depicted with an exposure pattern; a photo mask supporting means for supporting the photo mask; a contact means for relatively bringing the object to be exposed supported by the object to be exposed supporting means and the photo mask supported by the photo mask supporting means closer and into contact with each other; and a pressure regulating means for regulating a contact pressure between the object to be exposed and photo mask. Such contact pressure regulating means makes it possible to properly maintain a contact pressure between the photo mask and an object to be exposed and thereby to perform exposures with high accuracy.

Also, in a preferred embodiment, the aligner further comprises a guide means for guiding a movement of the photo mask supporting means, and the guide means guides the photo mask supporting means and capable of sloping the photo mask supporting means, whereby it becomes possible to maintain the parallelisms of the photo mask and object to be exposed and to perform exposures with high accuracy.

In a preferred embodiment, when the contact pressure is predominantly created by a combined weight of the photo mask to be laid over the object to be exposed and the photo mask supporting means, a means for regulating the contact pressure may be arranged to regulate the contact pressure by regulating a load to the object to be exposed, which is generated by the combined weight.

Also, in a preferred embodiment, the photo mask supporting means may comprise a mask holder for mounting the photo mask, a copy frame for supporting the mask holder, and spacers interposed between the copy frame and mask holder to space them a given distance apart and to fix the mask holder to the copy frame at two locations, whereby the deformation of the photo mask can be suppressed.

Further, in a preferred embodiment, the photo mask may be provided with tapered portions in the periphery of the photo mask to provide an aligner suitable for step exposure.

In the case of stepping exposure, although the photo mask is smaller than the object to be exposed, the photo mask juts toward the object to be exposed compared to the photo mask supporting means, whereby the contact properties of the photo mask and the object to be exposed can be improved. To improve the contact properties, in a preferred embodiment, the photo mask is provided with tapered portions in the periphery of the photo mask, and supported by the photo mask supporting means at the tapered portions, which allows the photo mask to jut toward the object to be exposed with a maximum jutting height.

BRIEF DESCRIPTION OF THE DRAWNNGS

FIG. 11 shows an enlarged view of the copy frame 1 and the mask holder 2; and

DETAILED DESCRIPTION OF THE PREFERRED EMBODIMENTS

Figure 1:
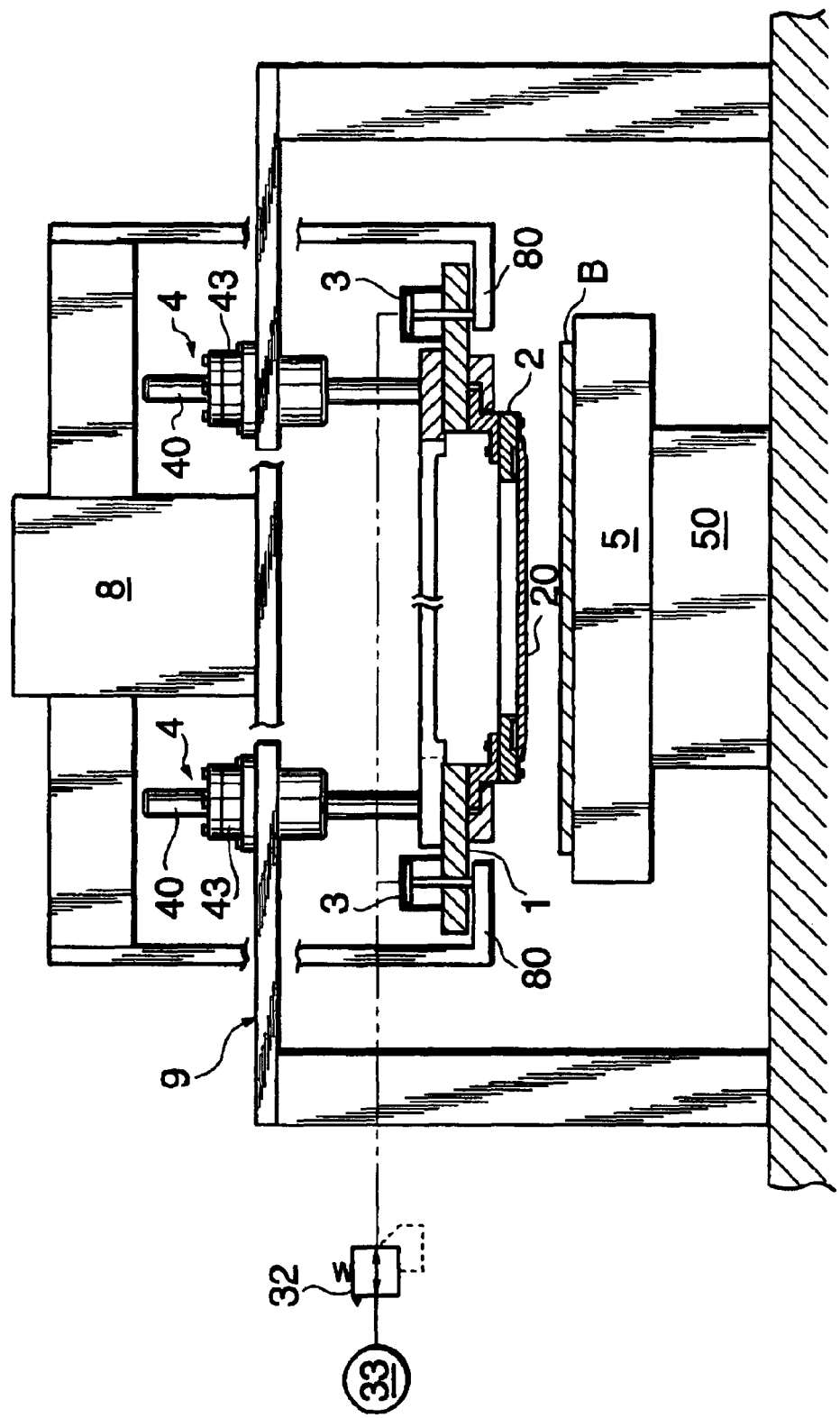
FIG. 1 shows a schematic front view of an embodiment of the invention.

An embodiment of the invention will be described with reference to the drawings below.

Turning to FIGS. 1 to 4, a photo mask 20 depicted with a circuit pattern is supported by a copy frame 1 through a mask holder 2 and a printed circuit board B of an object to be exposed is placed on a platen 5. The platen 5 can be moved in X and Y directions and rotated (in the θ direction) by a moving stage 50.

The copy frame 1, which is placed on supporting arms 80 of a Z-axis moving system 8, is arranged to be moved in the direction of Z-axis (i.e. upward and downward directions in this embodiment), so that the copy frame 1 can be moved down by the Z-axis moving system 8 to be placed on the printed circuit board B.

Figure 2:
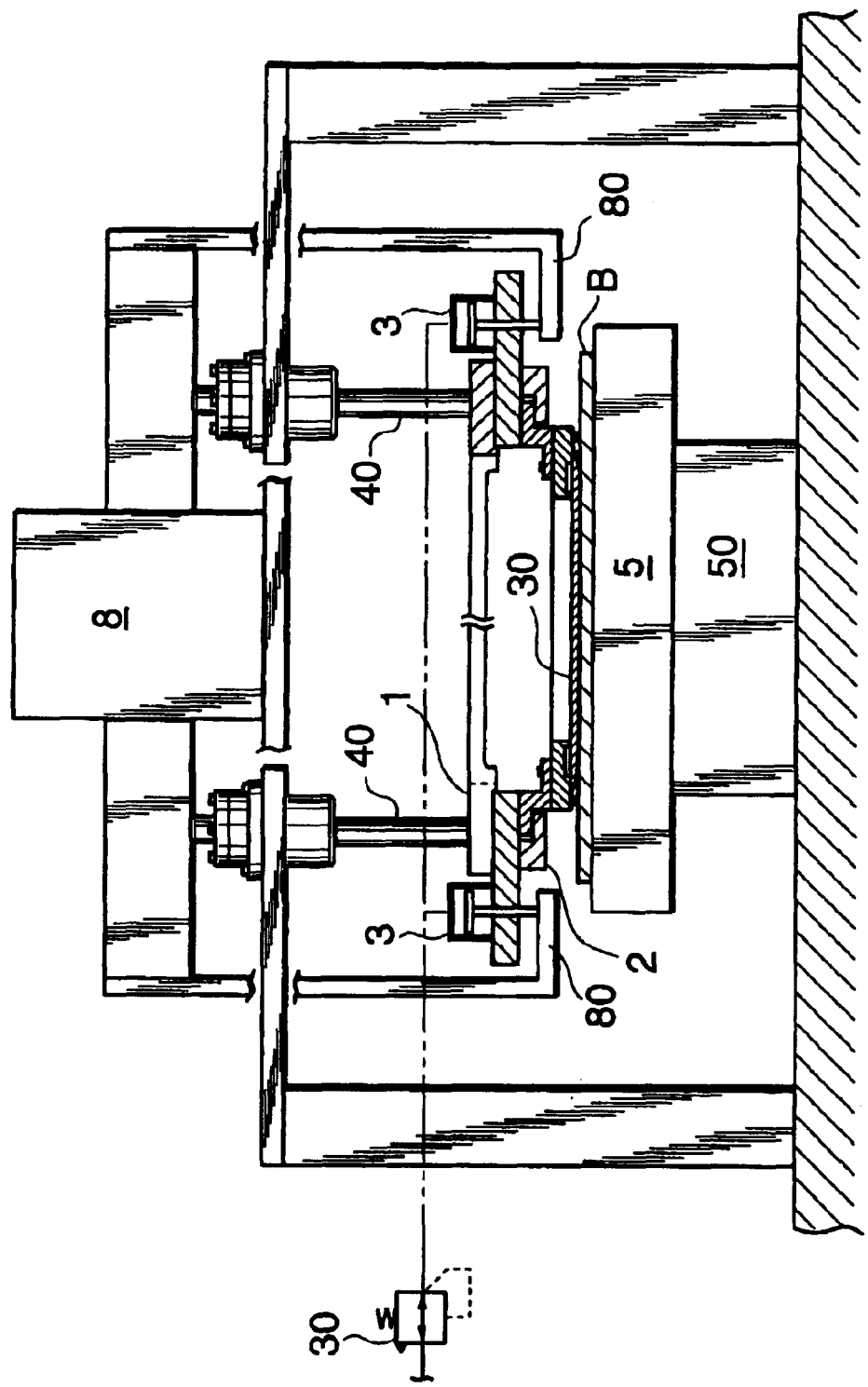
FIG. 2 shows a schematic front view showing the operation of the embodiment of the invention.

A photo mask 20 is mounted through the mask holder 2 on one side of the copy frame 1 where the printed circuit board B is located, as described above. As shown in FIG. 2, the photo mask 20 is arranged to be placed in close contact with the printed circuit board B to print a circuit pattern on the printed circuit board B by exposing from a light source for exposure (not shown) located above the photo mask 20.

Figure 3:
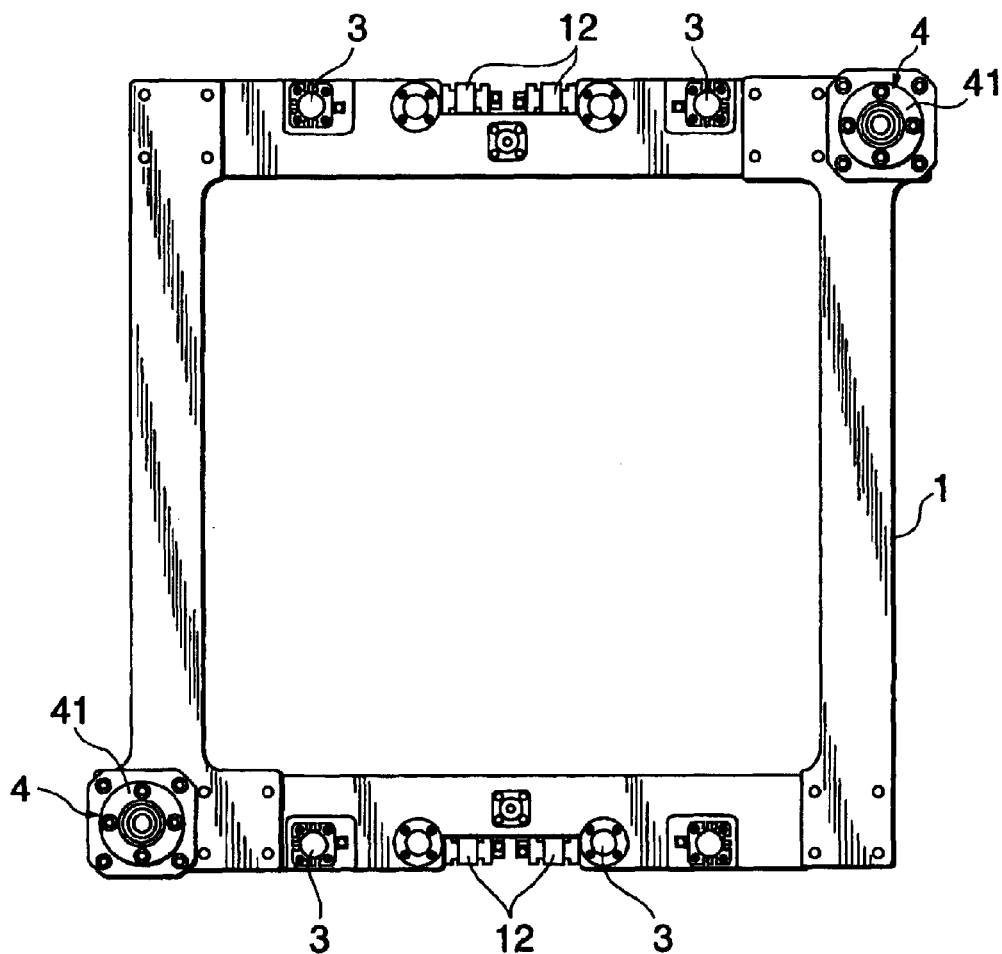
FIG. 3 shows a plan view of the copy frame in the embodiment of the invention.
Figure 4:
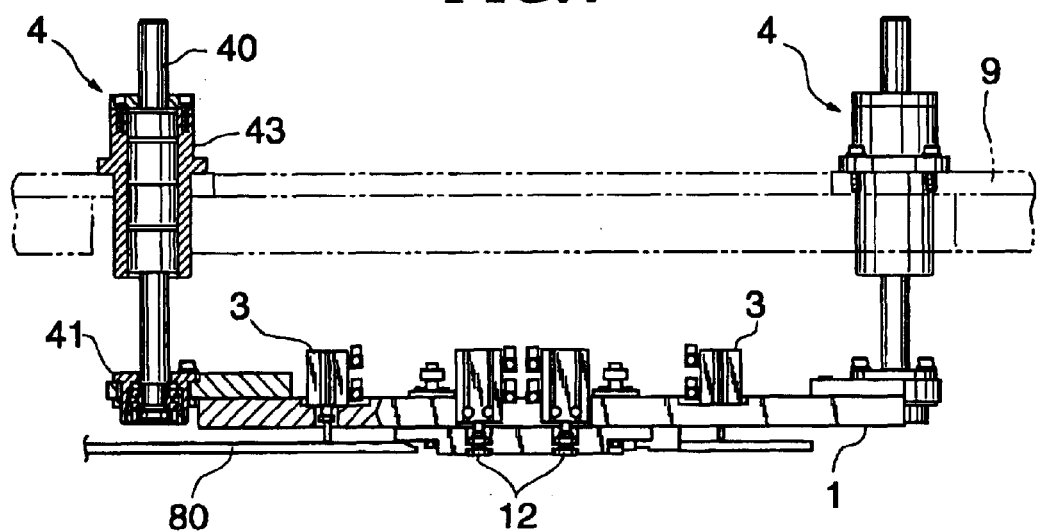
FIG. 4 shows a side view of the copy frame in the embodiment of the invention.

As shown in FIG. 3, two guide systems 4 are mounted in two corners of the copy frame 1 diagonally opposite each other. The guide systems 4 are connected to a frame 9 to maintain a position of the copy frame 1 in X and Y directions correctly.

The guide systems 4 each comprise a guide shaft 40, a shaft support 41 for receiving the guide shaft 40, and a stroke bearing 43.

Figure 5:
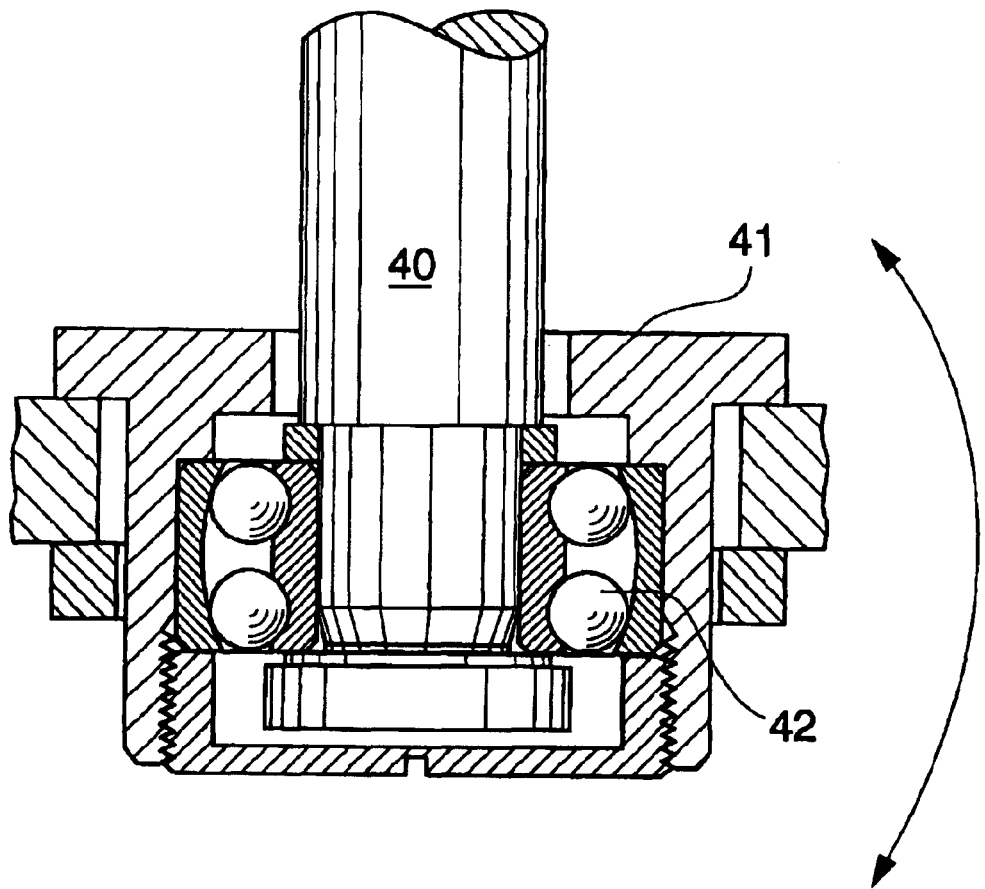
FIG. 5 shows an enlarged section view of the guide system 4 in the embodiment of the invention.

The shaft supports 41 are mounted in two corners of the copy frame 1 diagonally opposite each other and connected to the respective guide shafts 40. As shown in FIG. 5, the shaft support 41 is provided with bearings 42. The bearings 42 allow the guide shaft 40 to be manipulated on a slant in directions of 360 degrees, whereby the guide shaft 40 can form any given angle with the copy frame 1, as required.

The stroke bearing 43 is mounted on the frame 9 to receive the guide shaft 40 movably in an up and down direction, to control a position of the guide shaft 40 in X and Y directions, and thereby to maintain a position of the copy frame 1 in X and Y directions at a given position.

Therefore, the configuration of the guide systems 4 makes it possible to maintain a position of the copy frame 1, mask holder 2, and photo mask 20 in X and Y directions correctly, and to provide highly accurate exposure with no displacement caused by upward and downward movements of the Z-axis moving system 8.

Additionally, as described above, the copy frame 1 and guide shaft 40 can form an angle, so that the parallelism of the photo mask 20 relative to a printed circuit board B can be maintained. As a result, it becomes possible to bring the photo mask 20 into close contact with the printed circuit board B uniformly.

Figure 6:
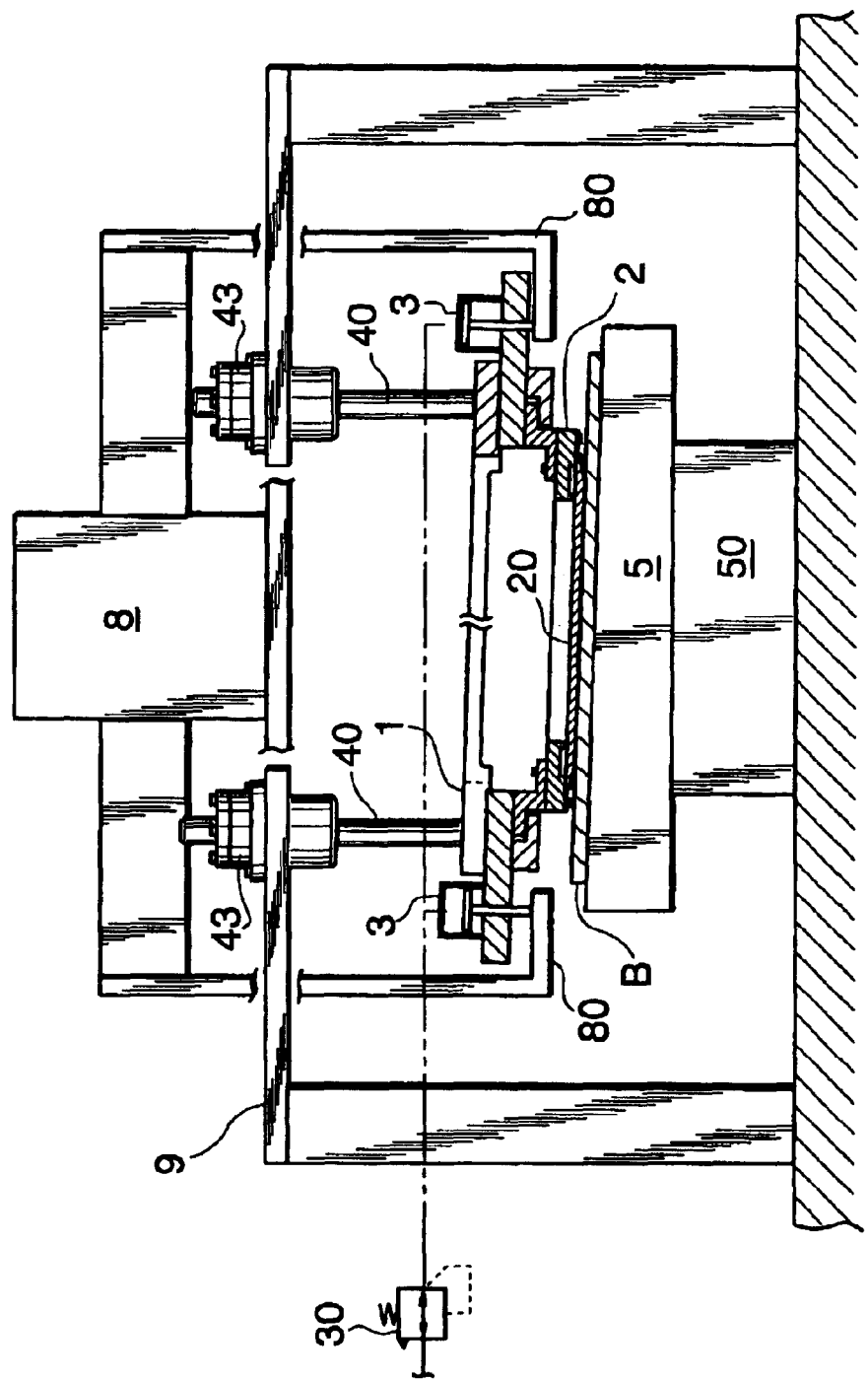
FIG. 6 shows an explanatory view showing the operation of the embodiment of the invention.

For example, as shown in FIG. 6, even when the parallelism of the copy frame 1 differs from that of the platen 5, the copy frame 1 can be manipulated on a slant with respect to the guide shaft 40, so that the copy frame 1 can be put on the printed circuit board B, owing to a total tare weight of the copy frame 1, mask holder 2, and the photo mask 20, along the slope of the platen 5 by moving the supporting arm 80 downward. Thus, it becomes possible to uniformly bring the photo mask 20 into close contact with the printed circuit board B.

Figure 7:
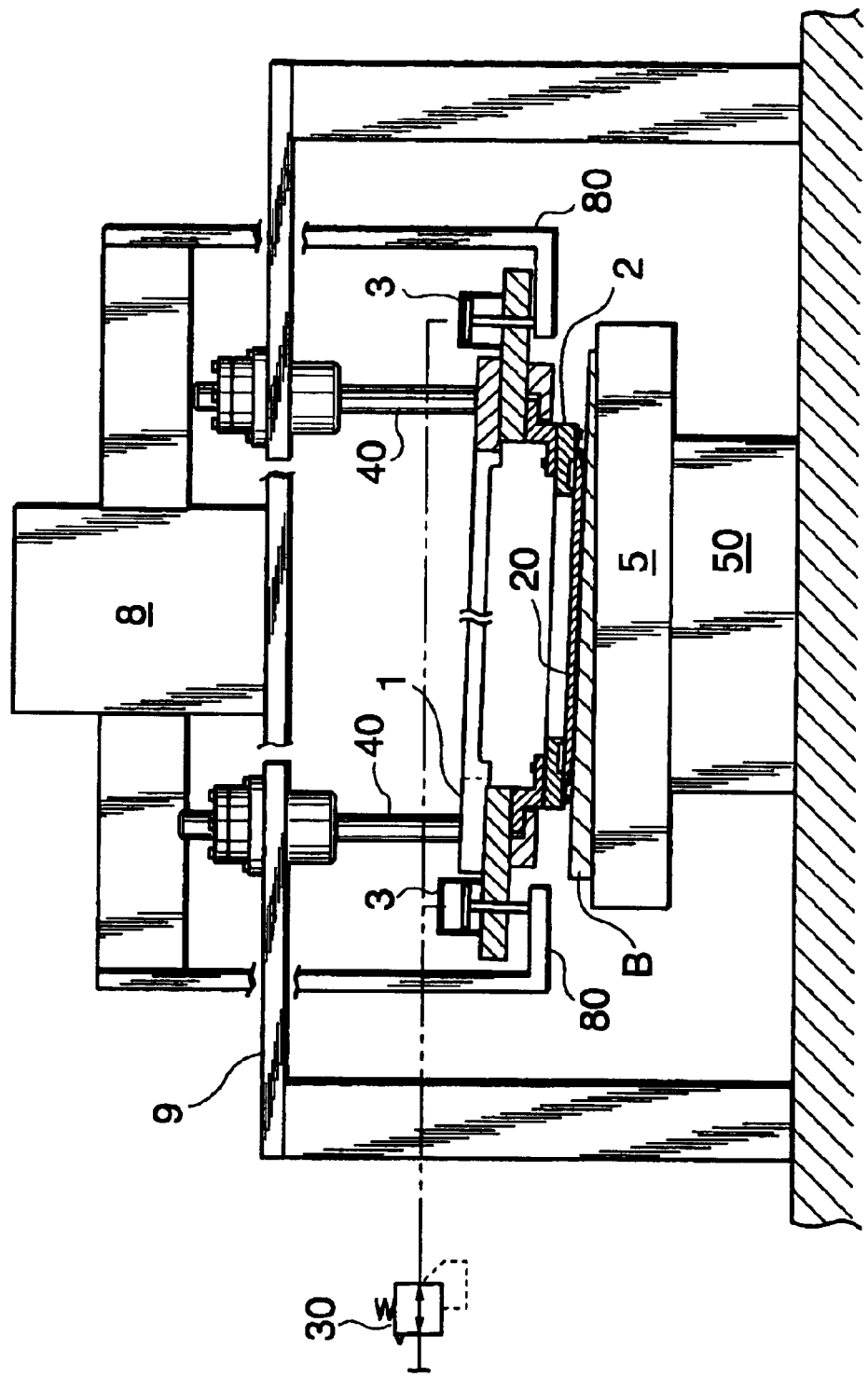
FIG. 7 shows an explanatory view of the operation of the embodiment of the invention.

Turning now to FIG. 7, there is illustrated an example of a printed circuit board B with an undesirable parallelism. Also in this case, the photo mask 20 can be brought into close contact with the printed circuit board B uniformly.

As shown in FIG. 1, load regulating systems 3 are each disposed between the copy frame 1 and the supporting arm 80. The load regulating systems 3 are provided at total four locations, two locations for each of opposed side portions of the copy frame 1, as shown in FIG. 3. However, it is noted that the load regulating systems 3 are illustrated in dislocated locations for showing the structure of the load regulating systems 3 in FIG. 1.

Figure 8:
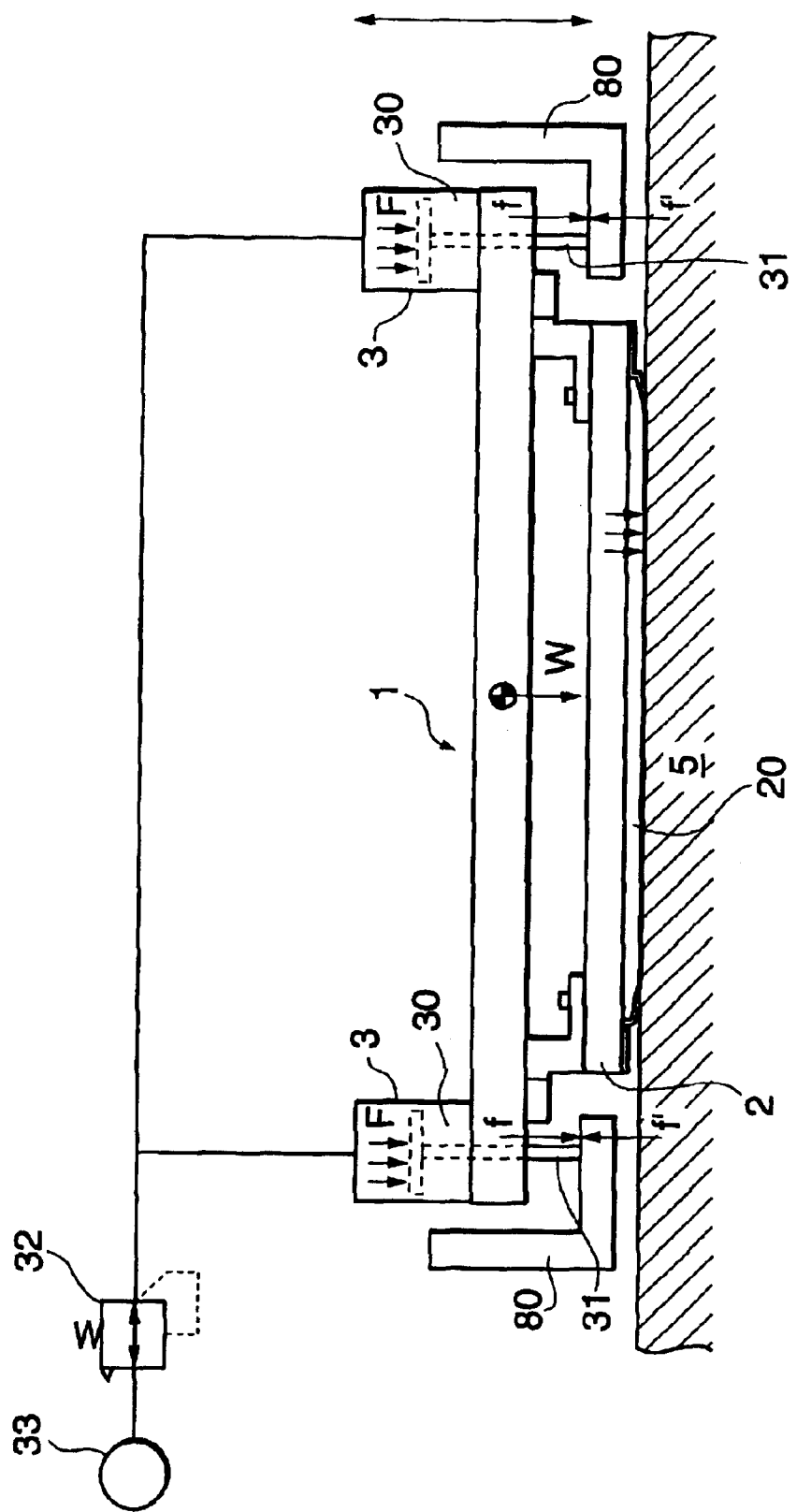
FIG. 8 shows an explanatory view of the operation of the load regulating system 3.

Now, turning to FIG. 8, in which each load regulating system 3 comprises a cylinder 30 connected to a pressurizing source 33 through a pressure reducing device 32 and a rod 31 of the cylinder 30. The rods 31 are placed on the supporting arms 80, whereby the load regulating system 3 comes in contact with the supporting arms 80 to support the copy frame 1, mask holder 2, and photo mask 20.

As shown in FIG. 8, when a fluid at a given pressure is fed into the cylinders 30 from the pressurizing source 33 with the photo mask 20 in close contact with a printed circuit board B, a weight W, which is produced by the copy frame 1, mask holder 2, and photo mask 20 and applied to the printed circuit board B, is reduced. In this way, a contact pressure between the printed circuit board B and the photo mask 20 can be regulated.

Now, if a pressure applied to the photo mask 20 (contact pressure) is represented by "w", then this "w" is expressed as follows.

$$w=(W-f)/(\text{a contact area of a glass mask and a printed circuit board}) \ (kgf/cm^2),$$

$$f=f'=AF(kg),$$

where, a tare weight: W(kg)

a pressure of fluid to be supplied to load regulating systems: F (kgf/cm$^2$)

an area which the load regulating system receives pressure and acts on: A (cm$^2$)

a thrust developed by the load regulating system: f (kg)

a reaction force against the thrust developed by the load regulating system: f (kg)

a pressure applied to a glass mask: w (kgf/cm$^2$)

As is clear from the foregoing, a contact pressure w can be regulated by changing F.

Although a configuration where a Z-axis moving system 8 is provided to move a photo mask 20 is adopted in the embodiment described above, the invention is not so limited and a printed circuit board B may be moved to bring the printed circuit board B into close contact with the photo mask 20. Also, both the printed circuit board B and photo mask 20 may be moved to do so.

Figure 9:
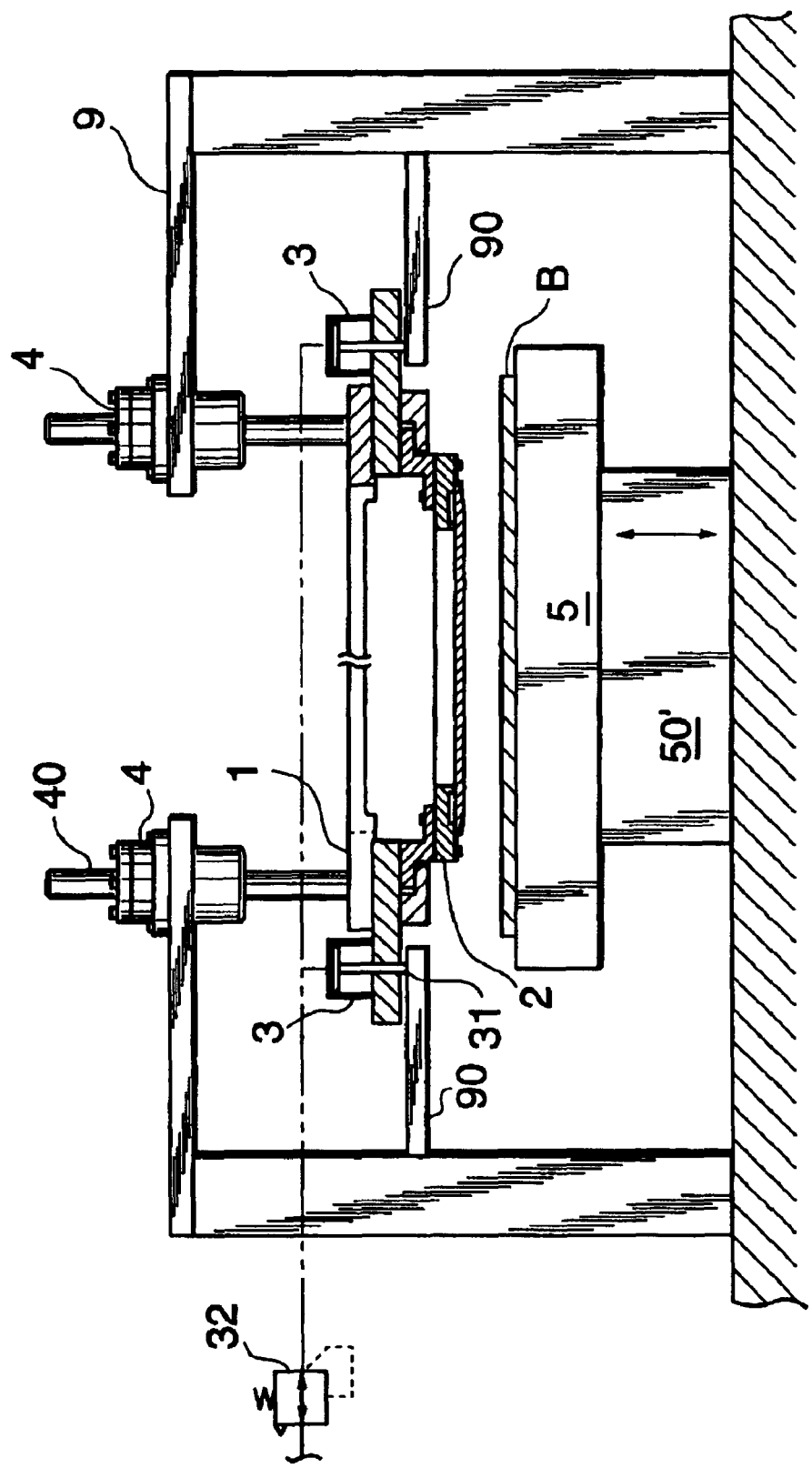
FIG. 9 shows a schematic front view of another embodiment of the invention.
Figure 10:
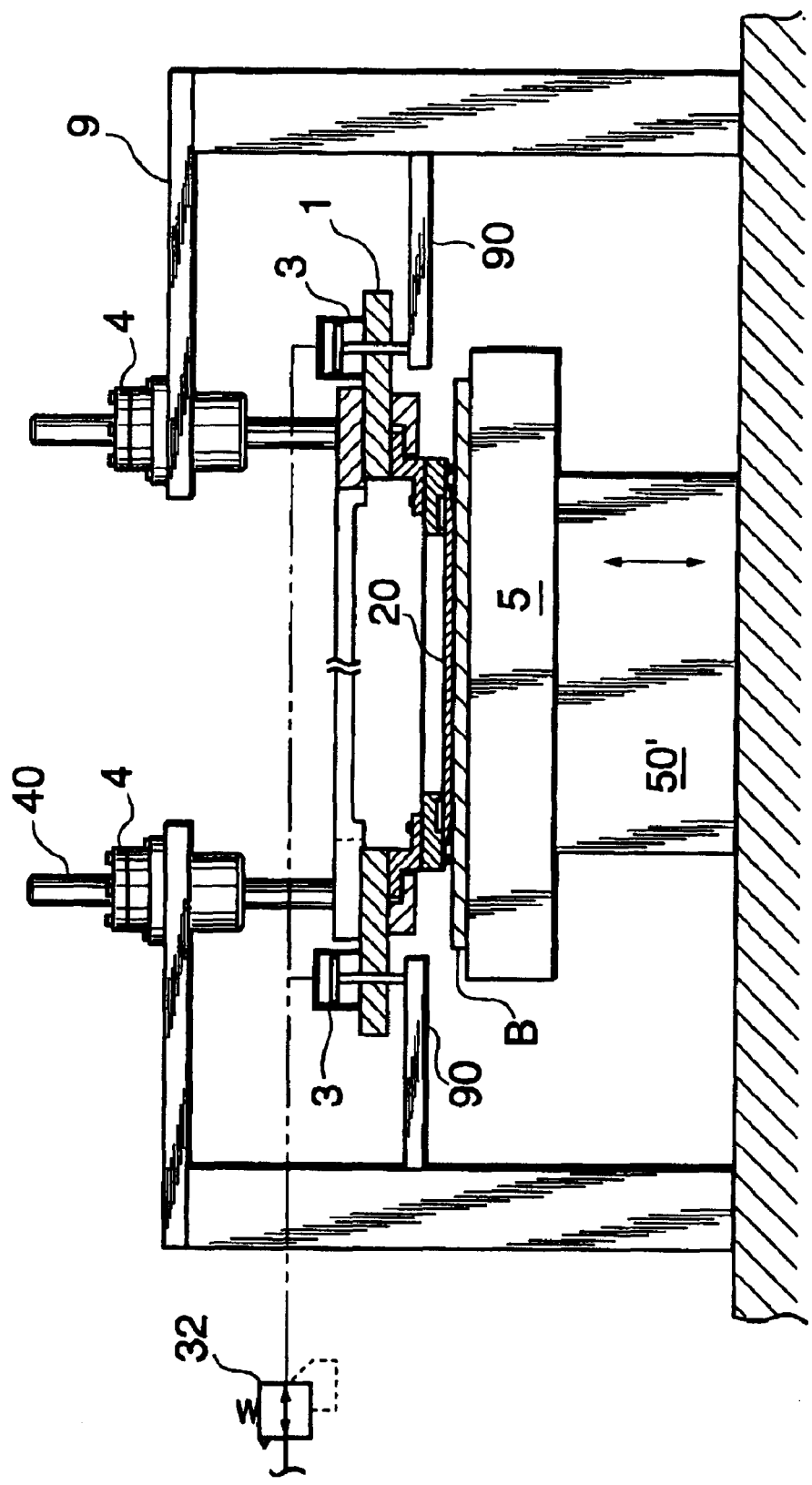
FIG. 10 shows a schematic front view showing the operation of another embodiment of the invention.

Turning now to FIGS. 9 and 10, there is illustrated another embodiment, in which a moving stage 50' capable of moving in Z direction as well as X and Y directions is adopted to lift a printed circuit board B to bring it into close contact with the photo mask 20.

A copy frame 1 is placed on supporting arms 90 of a frame 9 through rods 31. When a printed circuit board B is lifted to come into contact with a photo mask 20, the photo mask 20 and the printed circuit board B are in a closely contacted state gradually by their tare weight.

The contact pressure therebetween can be regulated through load regulating systems 3. Also, even when the parallelism of the printed circuit board B differs from that of the photo mask 20, against which measures can be taken by inclining the copy frame 1 relative to the guide shaft 40 as in the first embodiment.

Now, the structures of the copy frame 1 and mask holder 2 are described with reference to FIG. 11. A spacer 11 is interposed between the copy frame 1 and mask holder 2 to increase a distance between them, so that the photo mask 20 is not affected even with the attachment of a contamination D and a warp E, i.e. a non-uniform portion in flatness, of the copy frame 1 or mask holder 2.

Also in this embodiment, as in FIG. 3, the mask holder 2 is held by fixing portions 12, which are provided on the central parts of a pair of opposed side portions of the copy frame 1, two for each side, whereby a distortion developing in the mask holder 2 and then the deformation of the photo mask 20 can be suppressed.

The photo mask 20 is arranged to jut in the direction toward the printed circuit board B compared to the mask holder 2 and to come into contact with the printed circuit board B first. This configuration may provide good contact properties even when the photo mask 20 contacts with a workpiece, such as a printed circuit board, more than once in step exposure.

Figure 12:
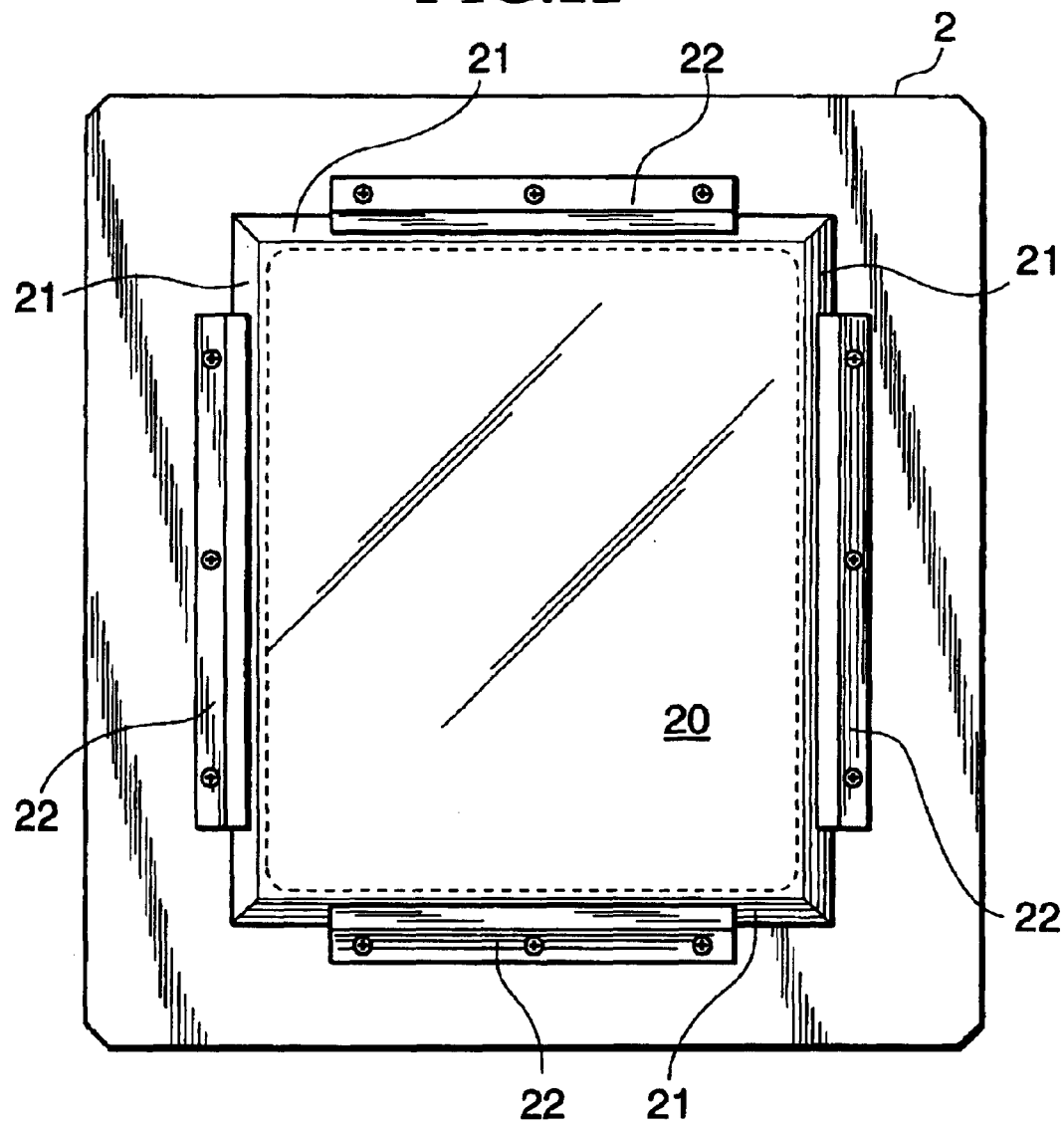
FIG. 12 shows an enlarged view of the mask holder 2 and tapered portion 21.

To jut the photo mask 20, the peripheral edge of the photo mask 20 is cut into tapered portions 21 as shown in FIG. 12, and the photo mask 20 is fastened to the mask holder 2 at the tapered portions 21 by fasteners 22.

Thus, it become possible to insure good contact properties in step exposure without other members jutting from the lower surface of the photo mask 20.

Therefore, as described above, the invention makes it possible to bring a photo mask into close contact with a printed circuit board uniformly, and provides an advantage of improving the accuracy of exposure.

What is claimed is:

1. An aligner comprising: an object supporting means for supporting an object to be exposed; a photo mask depicted with an exposure pattern; a photo mask supporting means for supporting said photo mask; a contact means for relatively bringing the object to be exposed supported by said object supporting means and said photo mask supported by said photo mask supporting means closer and into contact with each other, wherein a contact pressure is predominantly created by a combined weight of said photo mask to be laid over said object to be exposed and said photo mask supporting means; and a pressure regulating means for reducing said contact pressure between the object to be exposed and photo mask by creating a force which counteracts said combined weight.

2. The aligner of claim 1, wherein said photo mask is smaller than the object to be exposed and said photo mask juts toward to the object to be exposed compared to said photo mask supporting means.

3. The aligner of claim 2, wherein said photo mask is provided with tapered portions in the periphery of the photo mask, and supported by said photo mask supporting means at the tapered portions.

4. The aligner of claim 2, wherein said photo mask supporting means comprises: a mask holder for mounting said photo mask; a copy frame for supporting said mask holder; and spacers interposed between said copy frame and mask holder to space them a given distance apart and to fix said mask holder to said copy frame at two locations.

5. The aligner of claim 1, wherein said contact means brings the object to be exposed and photo mask into contact with each other while regulating their parallelisms.

6. The aligner of claim 1, further comprising a guide means for guiding a movement of said, photo mask supporting means, wherein said guide means guides said photo mask supporting means and capable of sloping the photo mask supporting means.

7. An aligner comprising: an object supporting means for supporting an object to be exposed; a photo mask depicted with an exposure pattern; a photo mask supporting means for supporting said photo mask; a contact means for relatively bringing the object to be exposed supported by said object supporting means and said photo mask supported by said photo mask supporting means closer and into contact with each other; and a pressure regulating means for regulating a contact pressure between the object to be exposed and photomask, wherein said photo mask is provided with tapered portions in the periphery of the photo mask, and supported by said photo mask supporting means at the tapered portions.

8. An aligner comprising: an object supporting means for supporting an object to be exposed; a photo mask depicted with an exposure pattern; a photo mask supporting means for supporting said photo mask; a contact means for bringing said photo mask into contact with the object to be exposed more than once for exposure, wherein a contact pressure is predominantly created by a combined weight of said photo mask to be laid over the object to be exposed and said photo mask supporting means; a pressure regulating means for reducing said contact pressure between the object to be exposed and the photo mask by creating a force which counteracts said combined weight, and wherein said photo mask is smaller than the object to be exposed and said photo mask juts toward the object to be exposed compared to said photo mask supporting means.

9. The aligner of claim 8, wherein said photo mask is provided with tapered portions in the periphery of the photo mask, and supported by said photo mask supporting means at the tapered portions.

10. The aligner of claim 8, wherein said contact means brings the object to be exposed and photo mask into contact with each other while regulating their parallelisms.

11. The aligner of claim 8, further comprising a guide means for guiding a movement of said photo mask supporting means, wherein said guide means guides said photo mask supporting means and capable of sloping the photo mask supporting means.

12. The aligner of claim 8, further comprising a pressure regulating means for regulating a contact pressure between the object to be exposed and photo mask.

13. An aligner comprising: an object supporting means for supporting an object to be exposed; a photo mask depicted with an exposure pattern; a photo mask supporting means for supporting said photo mask; a guide means for guiding a movement of said photo mask supporting means; a contact means for bringing said photo mask into contact with the object to be exposed more than once for exposure, wherein a contact pressure is predominantly created by a combined weight off said photo mask to be laid over the object to be exposed and said photo mask supporting means; and a pressure regulating means for reducing said contact pressure between the object to be exposed and the photo mask by creating a force which counteracts said combined weight, wherein said guide means guides said photo mask supporting means and capable of sloping the photo mask supporting means, and said photo mask is smaller than the object to be exposed.

14. The aligner of claim 13, wherein said photo mask is provided with tapered portions in the periphery of the photo mask, and supported by said photo mask supporting means at the tapered portions.

15. The aligner of claim 13, further comprising a pressure regulating means for regulating a contact pressure between the object to be exposed and photo mask.

* * * * *